United States Patent
Miyano (10) Patent No.: US 8,120,403 B2
(45) Date of Patent: Feb. 21, 2012

(54) DUTY DETECTION CIRCUIT

(75) Inventor: Kazutaka Miyano, Chuo-ku (JP)

(73) Assignee: Elpida Memory, Inc., Tokyo (JP)

(*) Notice: Subject to any disclaimer, the term of this patent is extended or adjusted under 35 U.S.C. 154(b) by 0 days.

(21) Appl. No.: 12/468,608

(22) Filed: May 19, 2009

(65) Prior Publication Data

US 2009/0289680 A1 Nov. 26, 2009

(30) Foreign Application Priority Data

May 21, 2008 (JP) ................. 2008-133361

(51) Int. Cl.
*H03K 3/017* (2006.01)
*H03K 5/04* (2006.01)

(52) U.S. Cl. .............. 327/175; 327/31; 327/35; 327/37; 327/158; 327/172

(58) Field of Classification Search .............. 327/31–38, 327/172–176
See application file for complete search history.

(56) References Cited

U.S. PATENT DOCUMENTS

| | | | |
|---|---|---|---|
| 5,614,855 A | | 3/1997 | Lee et al. |
| 6,130,566 A | * | 10/2000 | Yokomizo ..................... 327/175 |
| 7,403,055 B2 | * | 7/2008 | Minzoni ....................... 327/175 |
| 7,821,310 B2 | * | 10/2010 | Yun et al. ...................... 327/158 |
| 2007/0047375 A1 | * | 3/2007 | Minzoni ....................... 365/233 |
| 2007/0152680 A1 | * | 7/2007 | Fujisawa et al. .............. 324/617 |

FOREIGN PATENT DOCUMENTS

JP 2006-60842 A 3/2006

* cited by examiner

*Primary Examiner* — Patrick O'Neill
(74) *Attorney, Agent, or Firm* — Sughrue Mion, PLLC (57) ABSTRACT

A semiconductor device includes a first duty determining circuit (20) and a second duty determining circuit (30). The first duty determining circuit (20) determines a duty correction condition for an input signal in a first predetermined cycle longer than a cycle of the input signal to obtain a first determination result and updates the duty correction condition for the input signal on the basis of the first determination result. The second duty determining circuit (30) determines the duty correction condition for the input signal in a second predetermined cycle shorter than first predetermined cycle to obtain a second determination result and updates the duty correction condition for the input signal only when the second determination result is fixed during a predetermined period.

19 Claims, 7 Drawing Sheets

DUTY DETECTION CIRCUIT

This application is based upon and claims the benefit of priority from Japanese patent application No. 2008-133361, filed on May 21, 2008, the disclosure of which is incorporated herein in its entirety by reference.

BACKGROUND OF THE INVENTION

1. Field of the Invention

This invention relates to a semiconductor device and, in particular, to a semiconductor device having a DRAM.

2. Description of Related Art

An SDRAM (Synchronous Dynamic Random Access Memory) performs an operation inside the memory in synchronization with a clock. In the SDRAM, a single data word is exchanged or transferred in one clock. A DDR (Double Data Rate)-SDRAM exchanges data on the rising and the falling edges of a clock so that two data words are sequentially exchanged. Accordingly, the DDR-SDRAM has a data rate twice that of the SDRAM.

In order to minimize an operation delay inside the memory, the DDR-SDRAM uses a DLL (Delay Locked Loop) for generating an internal clock in synchronization with an external clock. For the DLL to properly operate, it is necessary to input the external clock in a proper duty ratio. The "duty ratio" is equivalent in meaning to a ratio of a high level period or a low level period to one cycle period. Herein, the proper duty ratio is 50%. Hereinafter, "duty ratio" is hereinafter called "duty" because those skilled in the art abbreviate "duty ratio" to "duty". However, the external clock has a duty error (or duty ratio error) because it is impossible to completely remove noise, such as jitter, from the external clock. Therefore, the DLL used in the DDR-SDRAM has a duty determining circuit for detecting and correcting a duty error (or duty ratio error) of the internal clock.

In the DDR-SDRAM, a count value (duty correction condition) of a counter for correcting a duty (or duty ratio) must be frequently updated during a DLL locking period from the start of the DLL to the time when the DLL performs a stable operation. For this purpose, a related-art DDR-SDRAM uses a fixed-cycle duty determining circuit responsive to a determination trigger signal inputted in a predetermined cycle for performing duty detection and determination in the predetermined cycle to produce a determination result and for updating the duty correction condition (count value of the counter for correcting the duty (or duty ratio) on the basis of the determination result.

Figure 1:
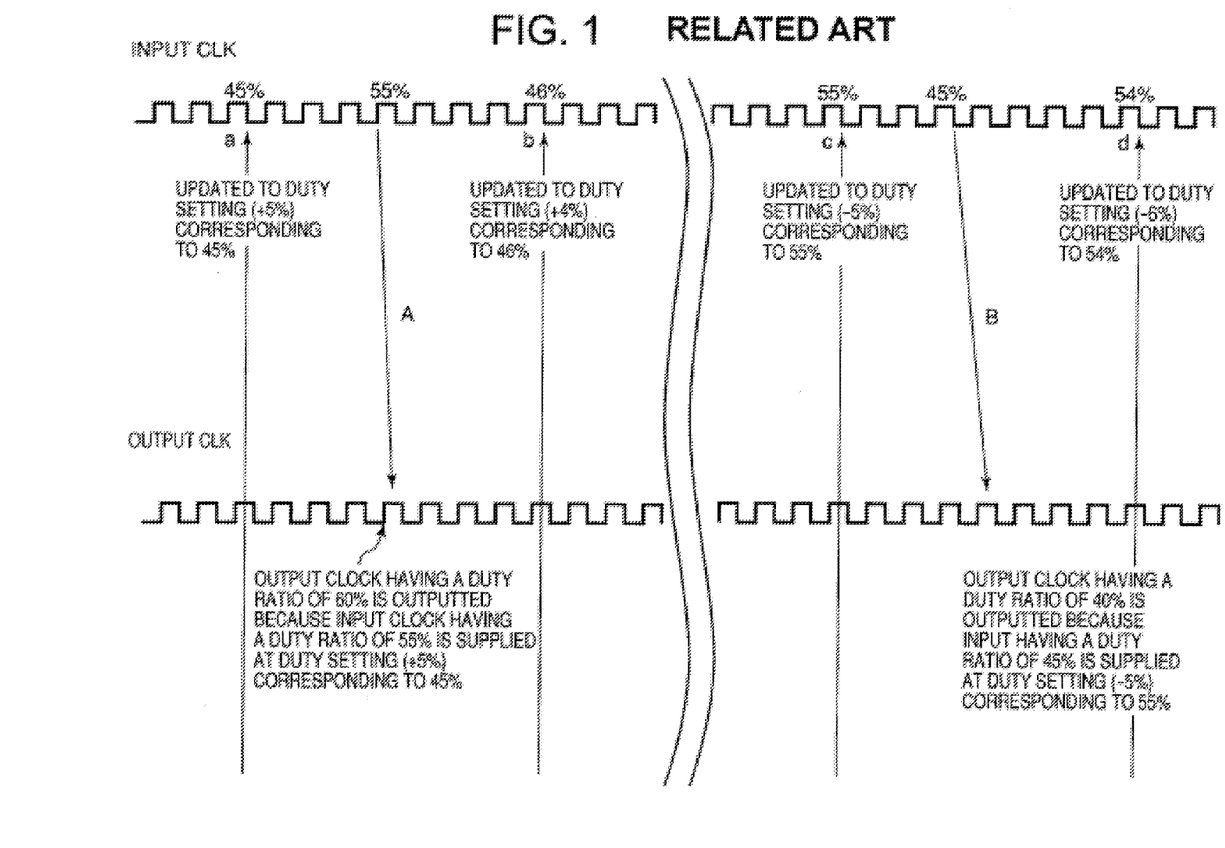
FIG. 1 is a waveform diagram for describing amplification of jitter when a fixed-cycle duty determining circuit is used.

However, the present inventor has recognized that the use of the above-mentioned fixed-cycle duty determining circuit causes a problem as shown in FIG. 1. Herein, in FIG. 1, each of numeric values specified on input clocks (input CLKs) shows a ratio of a high level period in each cycle period, i.e., a duty ratio.

Referring to FIG. 1, description will be made of a case where the input clocks supplied to the duty determining circuit have jitter fluctuating in a cycle close to a duty determining cycle. In the fixed-cycle duty determining circuit, the duty correction condition is updated in the predetermined cycle. Therefore, during a period between updates (updating operations) of the duty correction condition, duty correction is performed on the basis of a latest duty correction condition obtained in an immediately preceding update.

For example, it is assumed that the duty correction condition is updated at a point "a" in FIG. 1. Then, each clock (input clock) between the point "a" and a point "b" is subjected to duty correction on the basis of a count value of the counter, which is set at the point "a". In FIG. 1, an input clock at the point "a" has a duty ratio of 45%. Accordingly, a duty correction condition at the point "a" is set to correct a duty (duty ratio) by +5%. Therefore, for all output clocks (output CLKs) between the points "a" and "b", the duty (duty ratio) is corrected by +5%. Consequently, in a cycle with a duty ratio of 55%, an output clock having a duty ratio of 60% is outputted as a result of correction by +5%, as shown at "A" in FIG. 1.

On the other hand, it is assumed that, at a point "c" in FIG. 1, the duty correction condition is updated on the basis of a clock cycle with a duty ratio of 55%, specifically, a count value of the counter for correcting a duty (duty ratio) is set to correct the duty (duty ratio) by −5%. Then, in a clock cycle with a duty ratio of 45% between the point "c" and a point "d", an output clock with a duty ratio of 40% is outputted, as shown at "B" in FIG. 1.

As a result of the above-mentioned correction, the input clocks (input CLKs) having the duty ratios varying in a range between 45% and 55% due to jitter are outputted as the output clocks (output CLKs) having the duty ratios varying in a range between 40% and 60%.

JP-A-2006-60842 (Patent Document 1) discloses that, in an abstract, duty cycle correcting amplifiers are employed to produce a DLL output clock having a desired duty cycle of, for example, 50%.

SUMMARY

As mentioned above, the present inventor has recognized that, when the fixed-cycle duty determining circuit is used, the output clocks have duty ratios varying in an amplified range as compared with the input clocks in case where the input clocks have jitter fluctuating in a cycle close to a duty determining cycle.

The Patent Document 1 (JP-A-2006-60842) discloses a method of continuously monitoring and adjusting a phase. However, with the above-mentioned method of the Patent Document 1, it is not possible to set updates of the duty correction condition to be performed in a predetermined cycle. Particularly, during the DLL locking period from the start of the DLL to the time when the DLL performs a stable operation, it is not possible to frequently update the duty correction condition.

Thus, it is not disclosed in Patent Document 1 to set the updates of the duty correction condition to be performed in a predetermined cycle and to frequently update the duty correction condition during the DLL locking period.

The present invention seeks to solve one or more of the above problems, or to improve upon those problems at least in part.

In one embodiment, there is provided a semiconductor device comprising:

a first duty determining circuit that determines a duty correction condition for an input signal in a first predetermined cycle longer than a cycle of the input signal to obtain a first determination result and that updates the duty correction condition for the input signal on the basis of the first determination result; and a second duty determining circuit that determines the duty correction condition for the input signal in a second predetermined cycle shorter than the first predetermined cycle to obtain a second determination result and that updates the duty correction condition for the input signal only when the second determination result is fixed during a predetermined period.

In another embodiment, there is provided a device comprising:

a first duty detection circuit that detects a duty ratio of an input signal and outputs a first signal to adjust the duty ratio of the input signal, the duty ratio of the input signal being updated in response to the first signal in every first predetermined period; and a second duty detection circuit that detects the duty ratio of the input signal and outputs a second signal to adjust the duty ratio of the input signal, the duty ratio of the input signal being kept without being updated in response to the second signal when the second signal changes from a first logic level to a second logic level in a second predetermined period.

In a different embodiment, there is provided a device comprising:

a control circuit that selects a first duty detection circuit to adjust a duty ratio of an input signal in a first period and selects a second duty detection circuit to adjust the duty ratio of the input signal in a second period following the first period.

According to the embodiments, it is possible to obtain devices capable of selecting and using one of two kinds of duty determining circuits for updating a duty correction condition for an input signal.

BRIEF DESCRIPTION OF THE DRAWINGS

The above features and advantages of the present invention will be more apparent from the following description of certain preferred embodiments taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

According to a first embodiment of the present invention, which will be described hereinunder, a semiconductor device has two kinds of duty determining circuits one of which performs duty detection in a predetermined cycle and the other of which performs continuous duty detection. With this structure, jitter amplification in synchronization with cyclic jitter is suppressed.

The semiconductor device has a fixed-cycle duty determining circuit capable of performing duty detection and determination of a duty correction condition for an input signal in a predetermined cycle longer than a cycle of the input signal, and a continuous duty determining circuit capable of performing continuous duty detection and continuous determination of a duty correction condition. During a period from the start of a DLL to the time when the DLL performs a stable operation (DLL locking period), the semiconductor device uses the fixed-cycle duty determining circuit for duty detection and determination of a duty correction condition. After lapse of the DLL locking period, the semiconductor device uses the continuous duty determining circuit for duty detection and determination of a duty correction condition. Further, only when results of determination of the duty correction condition performed by the continuous duty determining circuit are not changed (are fixed) for a predetermined period, the duty correction condition (counter) is updated. Herein, the continuous duty determining circuit determines the duty correction condition for the input signal in a cycle identical to that of the input signal to be subjected to duty correction. Then, only when the results of determination of the duty correction condition are fixed for a predetermined period, the duty correction condition (counter) for the input signal is updated. The predetermined period mentioned above is longer than the cycle of the input signal. In the first embodiment which will be described in the following, the predetermined period is identical to the predetermined cycle mentioned above.

Figure 2:
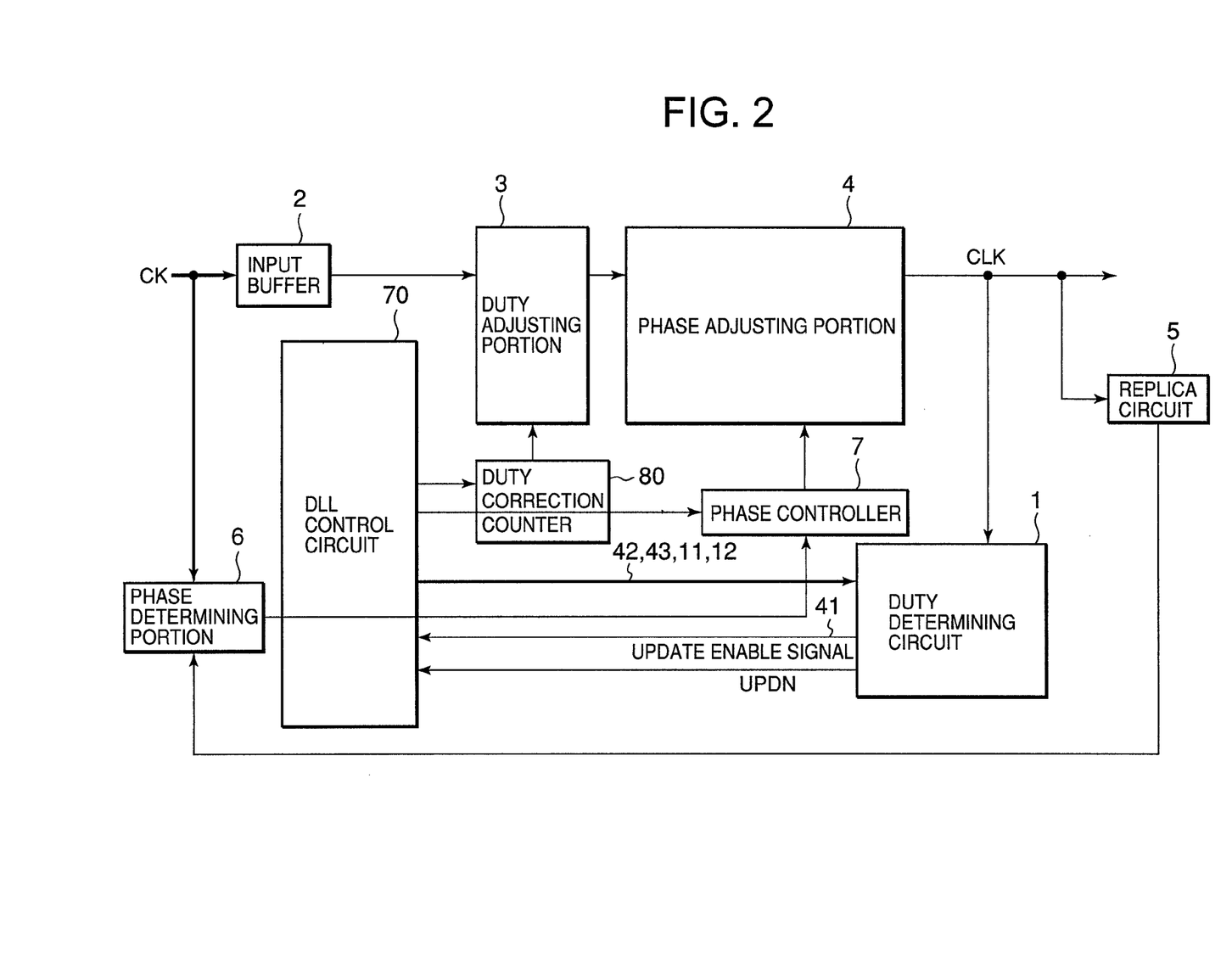
FIG. 2 is a block diagram showing an entire circuit of a DLL to which the present invention is applicable.

Referring now to FIG. 2, an entire circuit of the DLL to which the present invention is applicable is illustrated. The DLL comprises a duty determining circuit 1, an input buffer 2, a duty adjusting (or control) portion 3, a phase adjusting (or control) portion 4, a replica circuit 5, a phase determining portion 6, a phase controller 7, a DLL control circuit 70, and a duty correction counter 80.

The input buffer 2 is supplied with an external clock signal CK. The duty adjusting portion 3 is responsive to an output of the duty correction counter 80 and adjusts (or controls) a duty of the external clock signal CK from the input buffer 2 to supply a duty-adjusted (or duty-controlled) clock signal to the phase adjusting portion 4. The phase adjusting portion 4 outputs a DLL output clock signal CLK.

The phase determining portion 6 determines a phase difference between the DLL output clock signal CLK supplied from the phase adjusting portion 4 via the replica circuit 5 and the external clock signal CK. Supplied with an output of the phase determining portion 6, the phase controller 7 adjusts a phase of the clock signal in the phase adjusting portion 4. The phase adjusting portion 4 outputs a phase-adjusted clock signal as the DLL output clock signal CLK.

The DLL control circuit 70 controls the duty correction counter 80, the phase controller 7, and the duty determining circuit 1. The duty determining circuit 1 performs duty detection and determination of a duty correction condition for the DLL output clock signal CLK to output a result of the determination to the DLL control circuit 70. In the present invention, the duty determining circuit 1 has both of the fixed-cycle duty determining circuit capable of performing duty detection for an input signal in a predetermined cycle and a continuous duty determining circuit capable of performing continuous duty detection.

Figure 3:
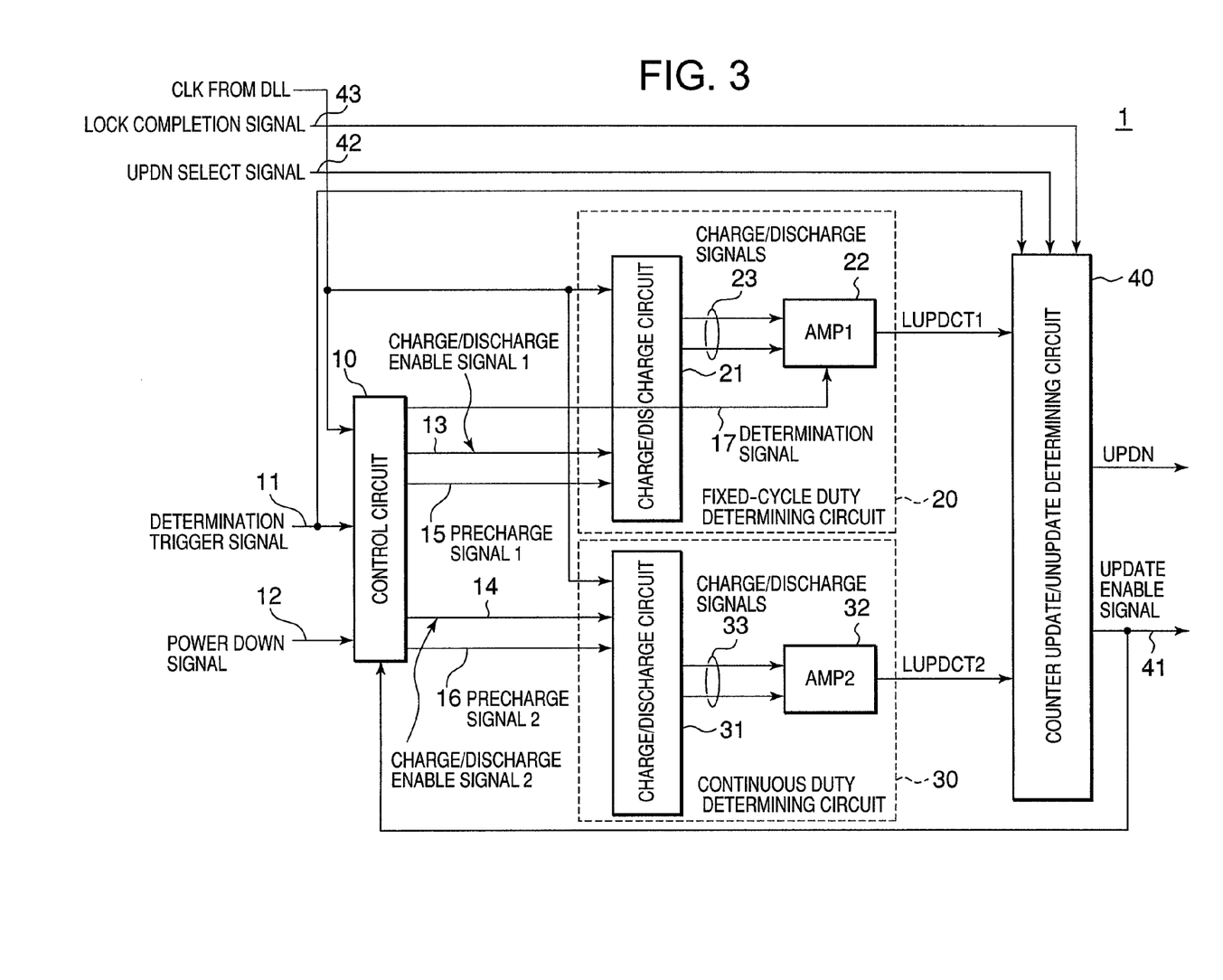
FIG. 3 is a block diagram of a semiconductor device according to one embodiment of the present invention.

Referring to FIG. 3, the semiconductor device according to the first embodiment of the present invention has the duty determining circuit 1 including a control circuit 10, a fixed-cycle duty determining circuit 20, a continuous duty determining circuit 30, and a counter update/unupdate determining circuit 40.

The control circuit 10 receives the output clock signal CLK from the DLL in FIG. 2 as an input signal, receives a determination trigger signal 11 and a power down signal 12 from the DLL control circuit 70 in FIG. 2, and receives an update enable signal 41 which is an output of the counter update/ unupdate determining circuit 40. The control circuit 10 outputs a charge/discharge enable signal 1 (13), a charge/discharge enable signal 2 (14), a precharge signal 1 (15), a precharge signal 2 (16), and a determination signal 17. Herein, the determination signal 17 is a signal outputted in a predetermined cycle.

The fixed-cycle duty determining circuit 20 comprises a charge/discharge circuit 21 and an amplifier 22. Supplied with the charge/discharge enable signal 1 (13), the precharge signal 1 (15), and the output clock signal CLK, the charge/discharge circuit 21 outputs two charge/discharge signals 1 (23). Supplied with the determination signal 17, the amplifier 22 amplifies a potential difference between the two charge/discharge signals 1 (23) outputted from the charge/discharge circuit 21 to produce an amplified potential difference and compares the amplified potential difference with a predetermined reference potential to output a determination result signal LUPDCT 1 which represents a comparison result by "High" or "Low". Herein, the charge/discharge circuit 21 includes, for example, a capacitor for discharging only during a "High" period of the clock signal CLK and another capacitor for discharging only during a "Low" period of the clock signal CLK and outputs potentials of the two capacitors as the two charge/discharge signals 1 (23).

The continuous duty determining circuit 30 comprises a charge/discharge circuit 31 and an amplifier 32. Supplied with the charge/discharge enable signal 2 (14), the precharge signal 2 (16), and the clock signal CLK, the charge/discharge circuit 31 outputs two charge/discharge signals 2 (33). The amplifier 32 amplifies a potential difference between the two charge/discharge signals 2 (33) outputted from the charge/discharge circuit 31 to produce an amplified potential difference and compares the amplified potential difference with a predetermined reference potential to output a determination result signal LUPDCT 2 which represents a comparison result by "High" or "Low". Herein, the charge/discharge circuit 31 includes, for example, a capacitor for discharging only during a "High" period of the clock signal CLK and another capacitor for discharging only during a "Low" period of the clock signal CLK and outputs potentials of the two capacitors as two charge/discharge signals 2 (33). Further, the amplifier 32 outputs the determination result signal LUPDCT 2 in a cycle identical to that of the clock signal CLK.

The counter update/unupdate determining circuit 40 receives the determination result signal LUPDCT 1 outputted from the fixed-cycle duty determining circuit 20, the determination result signal LUPDCT 2 outputted from the continuous duty determining circuit 30, and the determination trigger signal 11, a UPDN select signal 42, and a lock completion signal 43 outputted from the DLL control circuit 70. The counter update/unupdate determining circuit 40 outputs to the DLL control circuit 70 the update enable signal 41 representative of whether or not a count value (duty correction condition) of the duty correction counter 80 (FIG. 2) is to be updated, and an update value signal UPDN representative of an update value for the count value of the duty correction counter 80.

Figure 4:
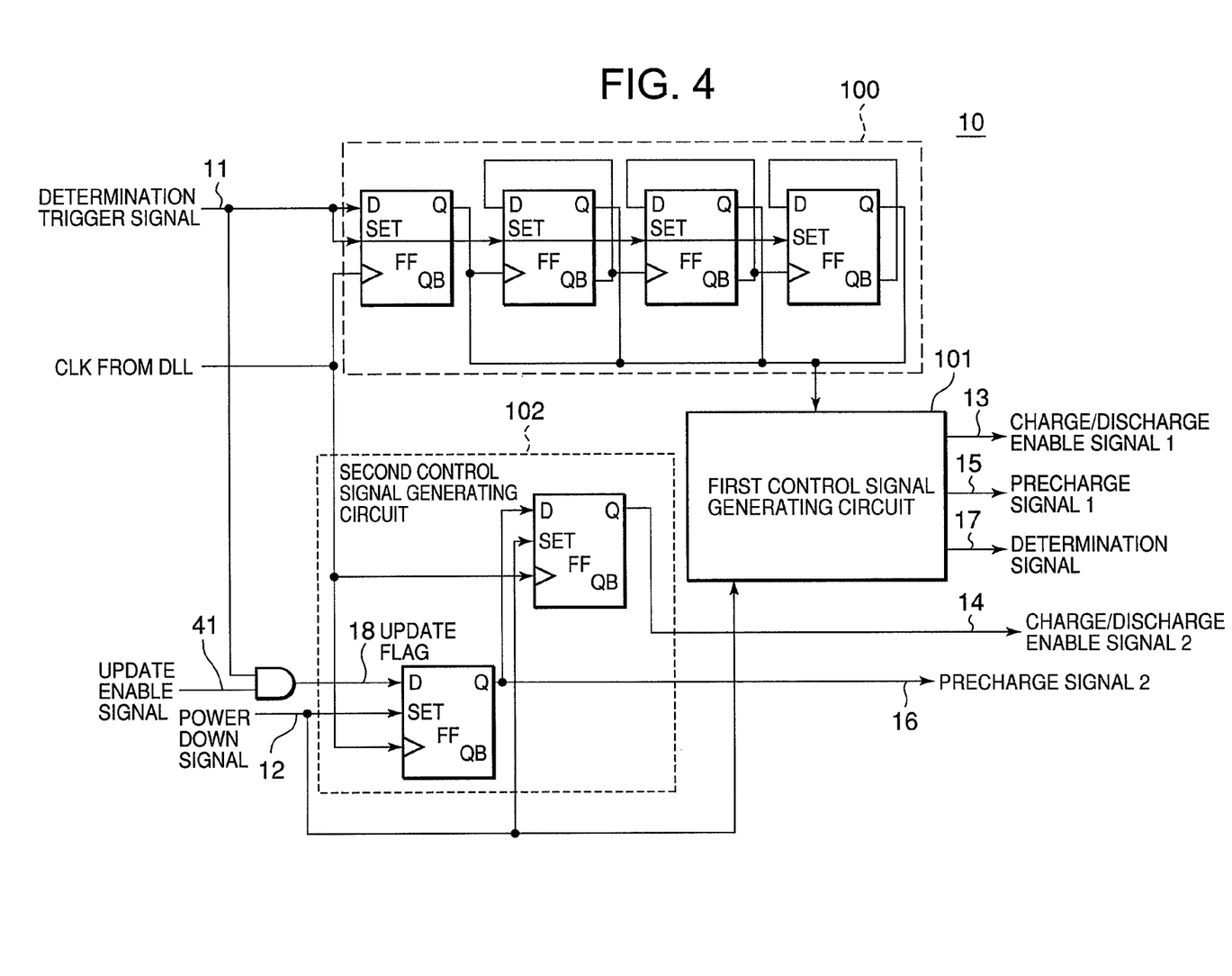
FIG. 4 is a block diagram of a control circuit in the semiconductor device shown in FIG. 3.

Referring to FIG. 4, a structure of the control circuit 10 is shown. The control circuit 10 comprises a clock counter 100 having four D-type flip-flops FF, a first control signal generating circuit 101, and a second control signal generating circuit 102 having two D-type flip-flops FF.

Supplied with the determination trigger signal 11 and the clock signal CLK, the clock counter 100 counts the number of clocks of the clock signal CLK. Supplied with an output of the clock counter 100, the first control signal generating circuit 101 outputs the precharge signal 1 (15), the charge/discharge enable signal 1 (13), and the determination signal 17 to the fixed-cycle duty determining circuit 20 (FIG. 3). Supplied with the clock signal CLK and an update flag 18 as a logical product (AND) between the determination trigger signal 11 and the update enable signal 41, the second control signal generating circuit 102 outputs the precharge signal 2 (16) and the charge/discharge enable signal 2 (14) to the continuous duty determining circuit 30 (FIG. 3). Especially, the second control signal generating circuit 102 outputs the precharge signal 2 (16) only when the update enable signal 41 is activated.

Further, the first and the second control signal generating circuits 101 and 102 are supplied with the power down signal 12 so as to stop operations of the fixed-cycle duty determining circuit 20 and the continuous duty determining circuit 30 during a power-down period.

Figure 5:
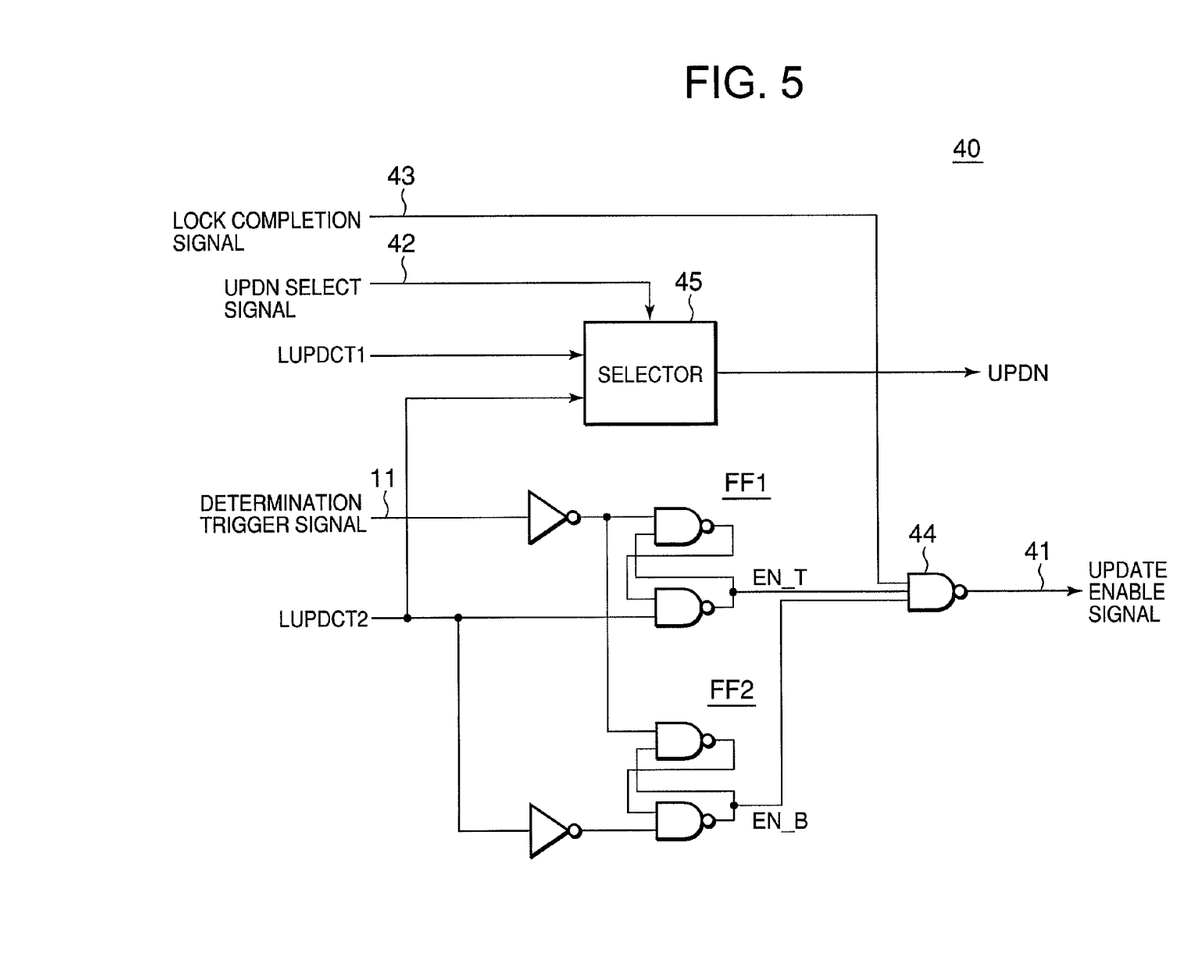
FIG. 5 is a block diagram of a counter update/unupdate determining circuit in the semiconductor device shown in FIG. 3.

Referring to FIG. 5, a structure of the counter update/unupdate determining circuit 40 is shown. The counter update/unupdate determining circuit 40 comprises a first flip-flop FF 1, a second flip-flop FF 2, a NAND element 44, and a selector 45.

Supplied with an inversion signal of the determination trigger signal 11 and the determination result signal LUPDCT 2, the first flip-flop FF 1 outputs a flip-flop output signal EN_T. Supplied with the inversion signal of the determination trigger signal 11 and an inversion signal of the determination result signal LUPDCT 2, the second flip-flop FF 2 outputs a flip-flop output signal EN_B. The NAND element 44 is supplied with the flip-flop output signals EN_T and EN_B and the lock completion signal 43 and outputs the update enable signal 41. The selector 45 receives the UPDN select signal 42 and outputs one of the determination result signals LUPDCT 1 and the LUPDCT 2 as an update value signal UPDN.

The first and the second flip-flops FF 1 and FF 2 are elements for determining whether or not the determination result signal LUPDCT 2 is changed during a predetermined period from an input of the determination trigger signal to an input of a next determination trigger signal (for example, a period identical to a cycle of the determination signal 17). One of the flip-flop output signals EN_T and EN_B has the L (Low) level only when the determination result signal LUPDCT 2 is not changed. Both of the flip-flop output signals EN_T and EN_B have the H (High) level when the determination result signal LUPDCT 2 is changed (from the H level to the L level or from the L level to the H level). Further, the NAND element 44 activates the update enable signal 41 when the lock completion signal has the H level and one of the flip-flop output signals EN_T and EN_B has the L level. Thus, when one of the flip-flop output signals EN_T and EN_B has the L level, an update is allowed. When both of the flip-flop output signals EN_T and EN_B have the H level, an update is not allowed.

Specifically, when the determination result signal LUPDCT 2 outputted from the continuous duty determining circuit 30 is changed or altered in the predetermined period, the counter update/unupdate determining circuit 40 deactivates the update enable signal 41 and supplies the control circuit 10 and the DLL control circuit 70 with information that an update of the duty correction condition is not allowed. At this time, in response to deactivation of the update enable signal 41, the DLL control circuit 70 in FIG. 2 inhibits an update of the duty correction condition.

Figure 6:
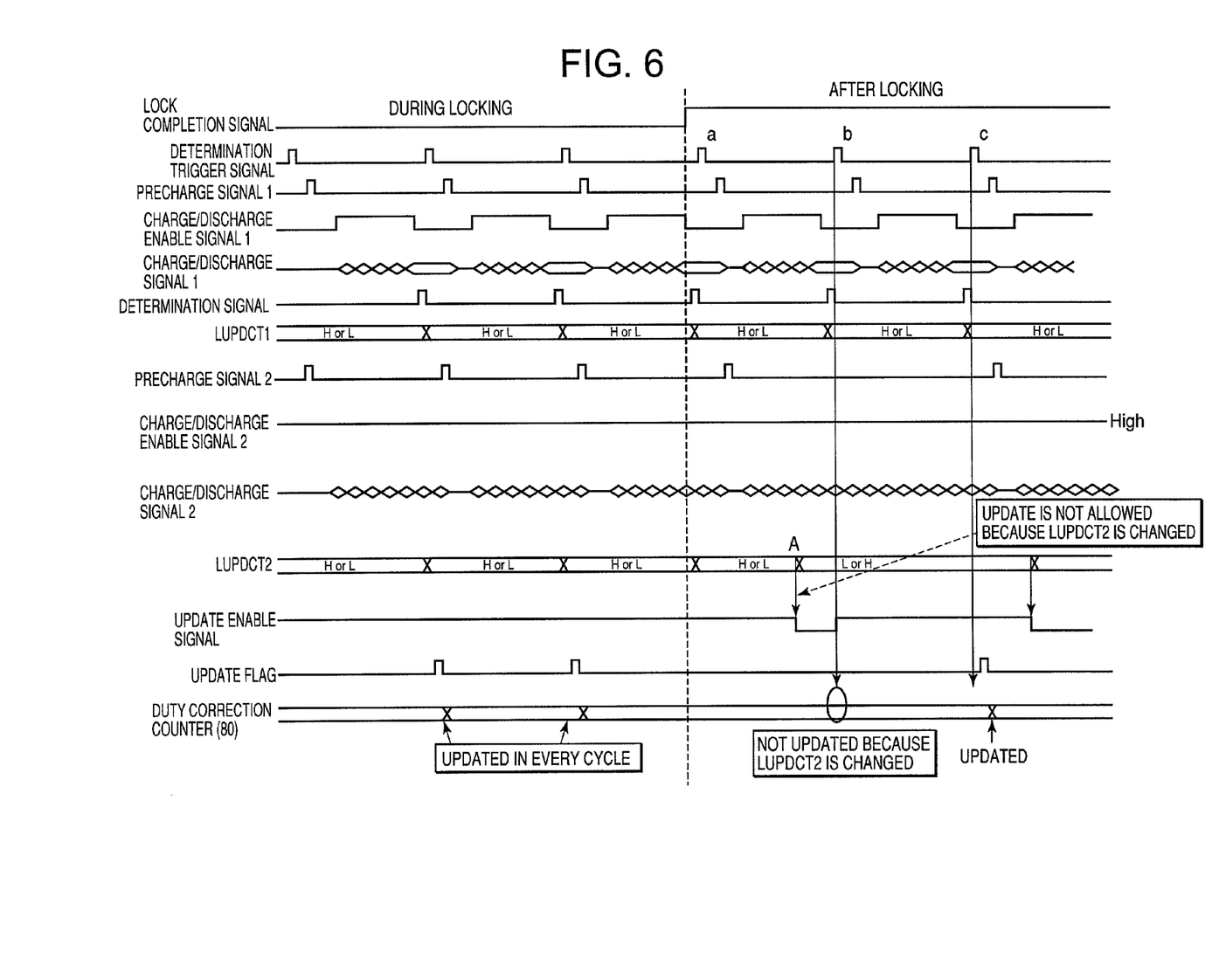
FIG. 6 is a waveform diagram for describing an operation of the semiconductor device shown in FIG. 3.

Next, referring to FIG. 6, an operation of the semiconductor device shown in FIG. 3 will be described.

In the semiconductor device according to the first embodiment of the present invention, an operation of duty detection and determination of a duty correction condition during the DLL locking period from the start of the DLL to the time when the DLL performs a stable operation is different from that after lapse of the DLL locking period. During the DLL locking period, the operation of duty detection and determination of a duty correction condition is performed in the predetermined cycle using the fixed-cycle duty determining circuit 20. This is because, during the DLL locking period, adjustment towards a duty ratio of 50% is being performed and therefore a counter update must be performed in every cycle and suspension of an update is meaningless. In this event, the lock completion signal representative of termination of the DLL locking period has the L level (a deactivated state) and an output (update enable signal 41) of the NAND element 44 is fixed to the H level (an activated state). Thereafter, when the DLL locking period is terminated, the lock completion signal becomes the H level (an activated state). Therefore, the output (update enable signal 41) of the NAND element 44 is released from the fixed state and the operation of determination of a duty correction condition in the continuous duty determining circuit 30 is started.

After locking of the DLL, control is performed such that, only when the counter update enable signal 41 has the High level, the count value of the duty correction counter 80 is updated. For example, as shown at "A" in FIG. 6, it is assumed that, between a determination trigger signal "a" and a determination trigger signal "b", the determination result signal LUPDCT 2 is changed. Then, the update enable signal becomes the L level. Therefore, the count value of the duty correction counter 80 is not updated at a timing of the determination trigger signal "b". On the other hand, it is assumed that, between the determination trigger signal "b" and a determination trigger signal "c", the determination result signal LUPDCT 2 is not changed. Then, the update enable signal is kept at the H level. Therefore, the count value of the duty correction counter 80 is updated at a timing of the determination trigger signal "c". When the count value of the duty correction counter 80 is updated, the precharge signal 2 (16) is generated and the charge/discharge signals 2 (33) are reset. Then, duty detection is started again in a state where integrated results of past duty detection are deleted.

As mentioned above, in the semiconductor device according to the embodiment of the present invention, during the DLL locking period, the count value of the duty correction counter 80 is frequently updated using the fixed-cycle duty determining circuit 20. After lapse of the DLL locking period, using the continuous duty determining circuit 30, the count value of the duty correction counter 80 is updated only when results of determination of a duty correction condition are identical in the predetermined period.

With the structure mentioned above, during the DLL locking period, the count value of the duty correction counter 80 can be frequently updated. Further, after lapse of the DLL locking period, control is performed so that, when the result of determination of a duty correction condition is changed under the influence of jitter of the input clock, the count value of the duty correction counter 80 is not updated. It is therefore possible to suppress, in presence of jitter which fluctuates in a cycle close to a fixed cycle, generation of output clocks which have duty ratios varying in an amplified range as compared with input clocks.

Next, referring to FIG. 7 in addition to FIGS. 3 and 5, description will be made of examples 1 and 2 of an operation after locking (after the DLL locking period) in the present invention.

Figure 7:
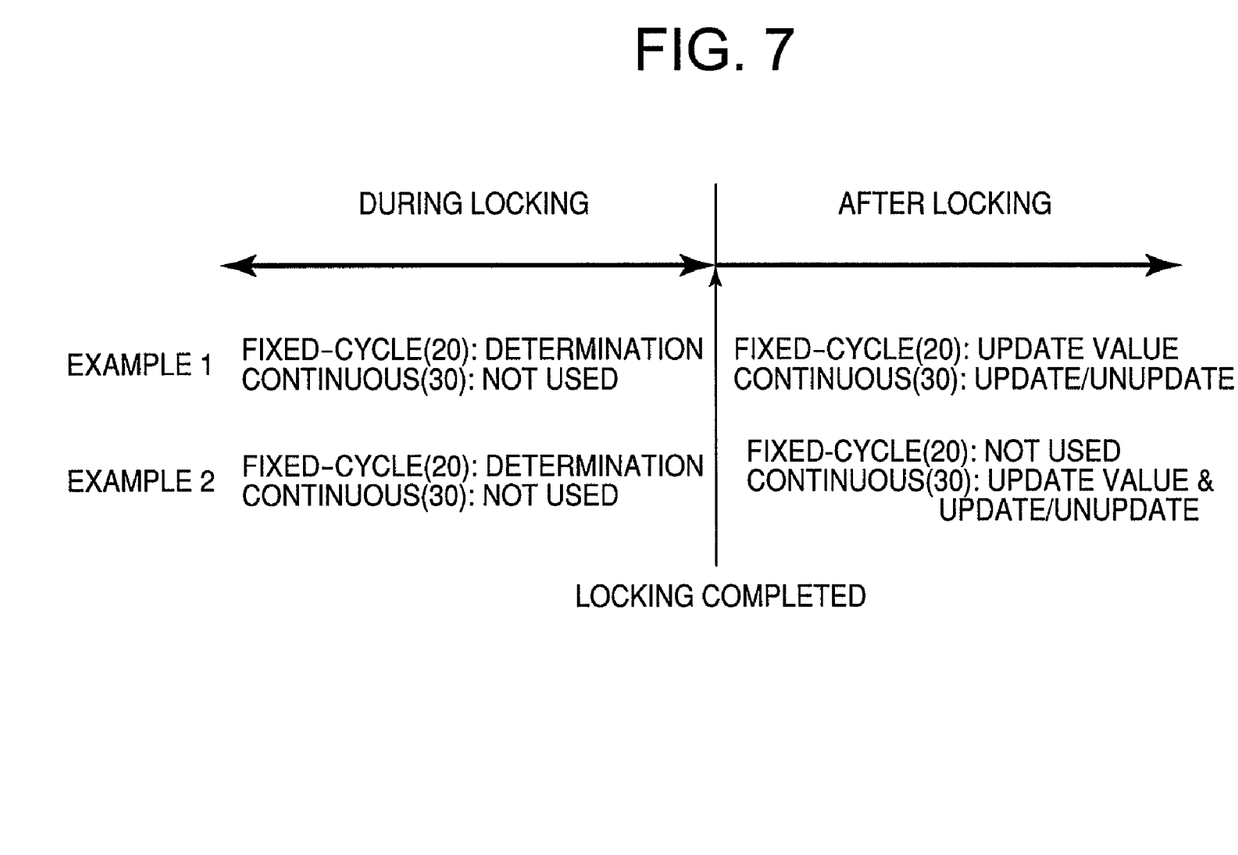
FIG. 7 is a view for describing examples 1 and 2 of an operation after locking (after a DLL locking period) in the present invention.

As shown as the examples 1 and 2 in FIG. 7, after locking (after the DLL locking period), the continuous duty determining circuit 30 is used at least for determination of whether or not the count value of the duty correction counter 80 is to be updated (the update enable signal 41). For the update value signal UPDN for the count value of the duty correction counter 80, either of the determination result signal (LUPDCT 1) of the fixed-cycle duty determining circuit 20 and the determination result signal (LUPDCT 2) of the continuous duty determining circuit 30 may be used (which is selected by the selector 45). It is noted here that, when the determination result signal (LUPDCT 1) of the fixed-cycle duty determining circuit 20 is used for the update value signal UPDN for the count value of the duty correction counter 80 (example 1), a duty detection result is reset in the predetermined cycle. Therefore, the update value signal UPDN for the count value of the duty correction counter 80 is set on the basis of a duty ratio in a limited period. On the other hand, when the determination result signal (LUPDCT 2) of the continuous duty determining circuit 30 is used for the update value signal UPDN for the count value of the duty correction counter 80 (example 2), the duty detection result is reset only when the count value of the duty correction counter 80 is updated. Therefore, the update value signal UPDN for the count value of the duty correction counter 80 is set on the basis of a duty ratio in a comparatively long period. Thus, when the determination result signal LUPDCT 2 is used, duty correction can be performed with higher accuracy as compared to the case where the determination result signal LUPDCT 1 is used.

In the manner described in conjunction with FIGS. 3-7, the semiconductor device according to the first embodiment of the present invention includes a first duty determining circuit (20) that determines a duty correction condition for an input signal (CLK FROM DLL) in a first predetermined cycle longer than a cycle of the input signal to obtain a first determination result and that updates the duty correction condition for the input signal on the basis of the first determination result; and a second duty determining circuit (30) that determines the duty correction condition for the input signal in a second predetermined cycle shorter than the first predetermined cycle to obtain a second determination result and that updates the duty correction condition for the input signal only when the second determination result is fixed during a predetermined period.

Preferably, the predetermined period is longer than the cycle of the input signal.

It is preferable that the first predetermined cycle and the predetermined period are identical to each other.

Preferably, the second predetermined cycle is substantially equal in time to the cycle of the input signal.

It is preferable that the first duty determining circuit (20) updates the duty correction condition in a first duty determining period, and the second duty determining circuit (30) updates the duty correction condition in a second duty determining period.

In this case, the input signal is an output clock of a DLL (Delay Locked Loop). The first duty determining period is a period from the start of the DLL to the time when the DLL performs a stable operation and the second duty determining period is a period after a DLL locking period.

Preferably, the semiconductor device further includes an update enable signal output circuit (40) that is supplied with a signal (LUPDCT 2) representative of the second determination result and a lock completion signal (43) representative of a first logic level during the first duty determining period and representative of a second logic level during the second duty determining period and outputs an update enable signal (41) representative of the first logic level when the duty correction condition is not to be updated and representative of the second logic level when the duty correction condition is to be updated.

In this case, the update enable signal output circuit (40) may have first and second flip-flops (FF1 and FF2) detecting a change of the signal representative of the second determination result. The update enable signal output circuit (40) outputs, as the update enable signal (41), a negative logical product (NAND) between the lock completion signal and output signals of the first and the second flip-flops (FF1 and FF2).

Preferably, the semiconductor device further includes a control signal generating circuit (102) that controls the second duty determining circuit (30). The control signal generating circuit (102) controls the second duty determining circuit (30) so that the second duty determining circuit (30) is reset after the duty correction condition is updated.

In FIGS. 3-7, the semiconductor device according to the first embodiment of the present invention may be understood as a device including: a first duty detection circuit (20) that detects a duty ratio of an input signal (CLK FROM DLL) and outputs a first signal (LUPDCT 1) to adjust the duty ratio of the input signal, the duty ratio of the input signal being updated in response to the first signal in every first predetermined period; and a second duty detection circuit (30) that detects the duty ratio of the input signal and outputs a second signal (LUPDCT 2) to adjust the duty ratio of the input signal, the duty ratio of the input signal being kept without being updated in response to the second signal when the second signal changes from a first logic level to a second logic level in a second predetermined period.

Preferably, the duty ratio of the input signal is updated in response to the second signal when the second signal maintains one of the first logic level and the second logic level in the second predetermined period.

It is preferable that the first predetermined period is substantially equal in time to the second predetermined period.

Preferably, the device further includes a duty adjusting circuit (3 in FIG. 2) to adjust the duty ratio of the input signal in response to one of the first signal (LUPDCT 1) and the second signal (LUPDCT 2).

The device may further includes a selector circuit (45) receiving the first signal (LUPDCT 1) and the second signal (LUPDCT 2) and outputting one of the first signal and the second signal to the duty adjusting circuit.

In this case, the device may further includes a control circuit (70 in FIG. 2) outputting a third signal (42) to the selector circuit (45), and wherein the selector circuit selects the one of the first signal and the second signal in response to the third signal.

Preferably, the device further includes a DLL circuit (4 in FIG. 2), and wherein the duty adjusting circuit (3) adjusts the duty ratio of the input signal in response to the first signal in an initial rise period of the DLL circuit and in response to the second signal after the initial rise period of the DLL circuit.

In FIGS. 3-7, the semiconductor device according to the first embodiment of the present invention may also be understood as a device including: a control circuit (10 and 40) that selects a first duty detection circuit (20) to adjust a duty ratio of an input signal (CLK FROM DLL) in a first period and selects a second duty detection circuit (30) to adjust the duty ratio of the input signal in a second period following the first period.

Preferably, the control circuit (10 and 40) controls to update the duty ratio of the input signal in response to an output (LUPDCT 1) of the first duty detection circuit (20) in the first period, and controls not to update the duty of the input signal in response to an output (LUPDCT 2) of the second duty detection circuit (30) when the output of the second duty detection circuit changes in the second period.

Preferably, the control circuit controls to update the duty ratio of the input signal in response to the output of the second duty detection circuit in the second period when the output of the second duty detection circuit maintains a predetermined logic level in the second period.

Alternatively, the device further includes a DLL circuit (4 in FIG. 2), and wherein the first period is an initial rise period of the DLL circuit and the second period is a period after the initial rise period of the DLL circuit.

It is apparent that the present invention is not limited to the above embodiments, but may be modified and changed without departing from the scope and spirit of the invention.

What is claimed is:

1. A semiconductor device comprising:
   a first duty determining circuit that determines a duty correction condition for an input signal in a first cycle longer than a cycle of the input signal to obtain a first determination result and that updates the duty correction condition for the input signal on the basis of the first determination result; and
   a second duty determining circuit that determines the duty correction condition for the input signal in a second cycle shorter than the first cycle to obtain a second determination result and that updates the duty correction condition for the input signal when the second determination result is fixed during a period.

2. The semiconductor device as claimed in claim 1, wherein the period is longer than the cycle of the input signal.

3. The semiconductor device as claimed in claim 1, wherein the first cycle and the period are identical to each other.

4. The semiconductor device as claimed in claim 1, wherein the second cycle is substantially equal in time to the cycle of the input signal.

5. The semiconductor device as claimed in claim 1, wherein:
   the first duty determining circuit updates the duty correction condition in a first duty determining period, and
   the second duty determining circuit updates the duty correction condition in a second duty determining period.

6. The semiconductor device as claimed in claim 5, wherein:
   the input signal is an output clock of a DLL (Delay Locked Loop);
   the first duty determining period is a period from the start of the DLL to the time when the DLL performs a stable operation; and
   the second duty determining period is a period after a DLL locking period.

7. The semiconductor device as claimed in claim 5, further comprising an update enable signal output circuit that is supplied with a signal representative of the second determination result and a lock completion signal representative of a first logic level during the first duty determining period and representative of a second logic level during the second duty determining period and outputs an update enable signal representative of the first logic level when the duty correction condition is not to be updated and representative of the second logic level when the duty correction condition is to be updated.

8. The semiconductor device as claimed in claim 7, wherein:
the update enable signal output circuit has first and second flip-flops detecting a change of the signal representative of the second determination result;
the update enable signal output circuit outputting, as the update enable signal, a negative logical product between the lock completion signal and output signals of the first and the second flip-flops.

9. The semiconductor device as claimed in claim 1, further comprising a control signal generating circuit that controls the second duty determining circuit, and wherein
the control signal generating circuit controls the second duty determining circuit so that the second duty determining circuit is reset after the duty correction condition is updated.

10. The semiconductor device as claimed in claim 1, wherein the second duty determining circuit is free from updating the duty correction condition for the input signal when the second determination result changes during the period.

11. A device comprising:
a first duty detection circuit detecting a duty ratio of a first input signal and generating in a first cycle a first signal to adjust the duty ratio of the first input signal;
a second duty detection circuit detecting the duty ratio of the first input signal and generating a second signal to adjust the duty ratio of the first input signal;
a selection circuit receiving the first and the second signals, generating a control signal and outputting one of the first and the second signals with the control signal, the selection circuit activating, when outputting the first signal, the control signal in the first cycle, and the selection circuit activating, when outputting the second signal, the control signal when the second signal maintains one of a first logic level and a second logic level in a period and deactivating, when outputting the second signal the control signal when the second signal changes from the first logic level to the second logic level in the period; and
a duty adjusting circuit receiving the one of the first and the second signals and the control signal from the selection circuit and adjusting the duty ratio of the first input signal in response to the one of the first and the second signals and an active level of the control signal.

12. The device as claimed in claim 11, further comprising a control circuit outputting a third signal to the selection circuit, and wherein the select or selection circuit outputs the one of the first signal and the second signal in response to the third signal.

13. The device as claimed in claim 11, further comprising a DLL circuit performing one of an initializing operation and a normal operation, wherein the selection circuit outputs the first signal in a first time period in which the DLL circuit performs the initializing operation and outputs the second signal in a second time period in which the DLL circuit performs the normal operation.

14. A device, comprising;
a first duty detection circuit receiving a first clock signal, detecting a duty ratio of the first clock signal and generating a first adjustment signal in response to the duty ratio of the first clock signal;
a second duty detection circuit receiving the first clock signal, detecting the duty ratio of the first clock signal and generating a second adjustment signal in response to the duty ratio of the first clock signal, the second duty detection circuit updating the second adjustment signal in response to the first clock signal;
a first control circuit generating a first control signal which is activated in a first cycle and supplying the first control signal to the first duty detection circuit such that the first duty detection circuit updates the first adjustment signal in response to an activation of the first control signal; and
a selection circuit receiving the first and the second adjustment signals, generating a second control signal and outputting one of the first and the second adjustment signals with the second control signal, the selection circuit activating, when outputting the first adjustment signal, the second control signal in the first cycle, and the selection circuit activating, when outputting the second adjustment signal, the second control signal when the second adjustment signal maintains one of a first logic level and a second logic level in a period and deactivating, when outputting the second adjustment signal the second control signal when the second adjustment signal changes from the first logic level to the second logic level in the period.

15. The device as claimed in claim 14, further comprising a duty adjusting circuit receiving a second clock signal, the one of the first adjustment signal and the second adjustment signal and the second control signal and outputting the first clock signal, the duty adjusting circuit adjusting a duty ratio of the second clock signal in response to the one of the first and the second adjustment signals and an active level of the second control signal so as to adjust the duty ratio of the first clock signal.

16. The device as claimed in claim 14, further comprising a second control circuit supplying a third control signal to the selection circuit, and wherein the selection circuit selects to output the one of the first and the second adjustment signals in response to the third control signal.

17. A device comprising:
a first duty detection circuit receiving a first signal and outputting a first adjustment signal, the first duty detection circuit being configured to update a logic level of the first adjustment signal to one of first and second logic levels in response to a duty ratio of the first signal at intervals of a first period of time;
a second duty detection circuit receiving the first signal and outputting a second adjustment signal, the second duty detection circuit being configured to update a logic level of the second adjustment signal to one of the first and second logic levels in response to the duty ratio of the first signal at intervals of a second period of time that is shorter in time than the first period of time;
a duty adjustment unit including a first input node and configured to produce the first signal and to control the duty ratio of the first signal in response to a control signal supplied to the first input node; and
a selector receiving the first and the second adjustment signals and configured to supply, as the control signal, to the first input node of the duty adjustment unit with the first adjustment signal thereafter with the second adjustment signal.

18. The device as claimed in claim 17, wherein the selector supplies, as the control signal, to the first node of the duty adjustment unit with the first adjustment signal from a power-on of the device at least to a time when the device operates stably.

19. The device as claimed in claim 17, wherein the first duty detection circuit includes a first capacitor that is charged or discharged in response to the first signal, and the first duty detection circuit is configured to compare a first voltage related to the first capacitor with a reference voltage to generate a first comparison result indicative of the duty ratio of the first signal and to update the logic level of the first adjustment signal to one of the first and second logic levels in response to the first comparison result at intervals of the first period of time, and a second duty detection circuit includes a second capacitor that is charged or discharged in response to the first signal, and the second duty detection circuit is configured to compare a second voltage related to the second capacitor with the reference voltage to generate a second comparison result indicative of the duty ratio of the first signal and to update the logic level of the second adjustment signal to one of the first and second logic levels in response to the second comparison result at intervals of the second period of time.

* * * * *